US007362156B2

United States Patent
Muranishi

(10) Patent No.: US 7,362,156 B2
(45) Date of Patent: Apr. 22, 2008

(54) RELIABLE PHASE ADJUSTMENT CIRCUIT

(75) Inventor: Koji Muranishi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 312 days.

(21) Appl. No.: 10/693,903

(22) Filed: Oct. 28, 2003

(65) Prior Publication Data

US 2004/0227553 A1    Nov. 18, 2004

(30) Foreign Application Priority Data

May 14, 2003    (JP)    ............................. 2003-135449

(51) Int. Cl.
*H03K 5/13*    (2006.01)
(52) U.S. Cl. ...................... 327/237; 327/321
(58) Field of Classification Search .............. 327/3, 327/12
See application file for complete search history.

(56) References Cited

U.S. PATENT DOCUMENTS

| | | | |
|---|---|---|---|
| 6,348,823 B1 * | 2/2002 | Pan | 327/159 |
| 6,707,727 B2 * | 3/2004 | Tamura et al. | 365/192 |
| 6,944,252 B2 | 9/2005 | Okamoto | |
| 6,959,061 B1 * | 10/2005 | Kuwata | 375/373 |
| 2003/0001634 A1 * | 1/2003 | Cao et al. | 327/158 |

FOREIGN PATENT DOCUMENTS

| | | | |
|---|---|---|---|
| JP | 5026923 | * | 2/1993 |
| JP | 2003-135449 | | 12/2001 |
| JP | 2002-111486 | | 4/2002 |

OTHER PUBLICATIONS

Excerpt Translation Reference No. KA003866 Mailing No. 460280 Mailing Date Dec. 6, 2006.

\* cited by examiner

*Primary Examiner*—Kenneth B. Wells
*Assistant Examiner*—Ryan C. Jager
(74) *Attorney, Agent, or Firm*—Donald R. Studebaker; Nixon Peabody LLP

(57) ABSTRACT

A phase adjustment circuit generates multiple clock signals by, for example, successively delaying a first clock signal. One of the generated clock signals is selected and output. A phase difference detector determines whether the phase of the selected clock signal and the phase of a second clock signal satisfy a given condition. The clock signal selection can changed until the condition is satisfied, either by external control by a device that monitors a signal output by the phase difference detector, or by a built-in selection signal generator. This scheme assures that two clock signals with phases satisfying the given condition are obtained, regardless of environmental factors or fabrication variations.

20 Claims, 4 Drawing Sheets

RELIABLE PHASE ADJUSTMENT CIRCUIT

BACKGROUND OF THE INVENTION

1. Field of the Invention

The present invention relates to a phase adjustment circuit for adjusting the phase relationship between a pair of clock signals.

2. Description of the Related Art

Some integrated circuits include a central processing unit (CPU) that needs to receive two clock signals having different frequencies and a predetermined phase relationship. For example, it may be necessary for all transitions of the lower-frequency clock signal to occur when the higher-frequency clock signal is in a specified (high or low) state. Although it is an easy matter to generate two clock signals satisfying this type of condition, the phase relationship between the clock signals may be altered by, for example, different propagation delays on the clock signal supply paths, so that by the time the clock signals reach the CPU, the necessary relationship may no longer obtain.

This problem is not unlike the problem of ensuring that the transitions in a data signal take place while a clock signal is in a specified state. Japanese Unexamined Patent Application Publication No. 2002-339366 discloses a phase adjustment circuit that receives a data signal DATAI and a clock signal CLKI, adjusts the phase of the clock signal CLKI so as to generate a clock signal CLKO having a desired timing relationship to the data signal DATAI, and outputs this clock signal CLKO together with the data signal DATAO.

In the disclosed phase adjustment circuit, a pair of transition monitoring circuits, operating on a system clock, detect transitions in the clock signal CLKI and data signal DATAI. A CLKI transition resets a counter that counts cycles of the system clock. A DATAI transition causes a register to latch the count value output by the counter. A delay circuit generates delayed clock signals in a plurality of delay patterns from clock signal CLKI. The delayed clock signals are input to a selector. The count value latched by the register is supplied to a circuit that generates a selection signal designating an optimum one of the delayed clock signals generated by the delay circuit. The selection signal is supplied to the selector, which selects the designated delayed clock signal and outputs it as clock signal CLKO.

For this conventional phase adjustment circuit to work, the delayed clock signals must have precisely predetermined delay times, but in practice, the delay times cannot be precisely predetermined, because they may vary due to inevitable fabrication variations in delay elements, and to variations in environmental conditions such as temperature or supply voltage. Because the selection signal is generated without regard to such variations in the delayed clock signals, there is no guarantee that the output clock signal CLKO will actually be the optimal clock signal.

SUMMARY OF THE INVENTION

An object of the present invention is to provide a phase adjustment circuit that can output a pair of clock signals that reliably satisfy a given condition.

The invented phase adjustment circuit receives a first clock signal and a second clock signal. A clock proliferator generates a plurality of clock signals by, for example, successively delaying the first clock signal. A clock selector selects one of the plurality of clock signals according to a selection signal, and outputs the selected clock signal. The second clock signal is also output. A phase difference detector determines whether the second clock signal and the selected clock signal satisfy a predetermined phase condition, and outputs a detection signal indicating whether the predetermined condition is satisfied.

The selection signal may be generated by an external circuit that monitors the detection signal and changes the value of the selection signal until the predetermined condition is satisfied.

Alternatively, the phase adjustment circuit may include a selection signal generator that generates the selection signal in accordance with the detection signal. For example, the selection signal may cyclically increment the value of the selection signal until the detection signal indicates that the condition is satisfied.

Since the phase difference detector directly determines whether the selected clock signal and the second clock signal satisfy the predetermined condition, the selector can reliably be made to select a clock signal such that the condition is satisfied, regardless of fabrication variations or varying environmental conditions.

DETAILED DESCRIPTION OF THE INVENTION

Figure 1:
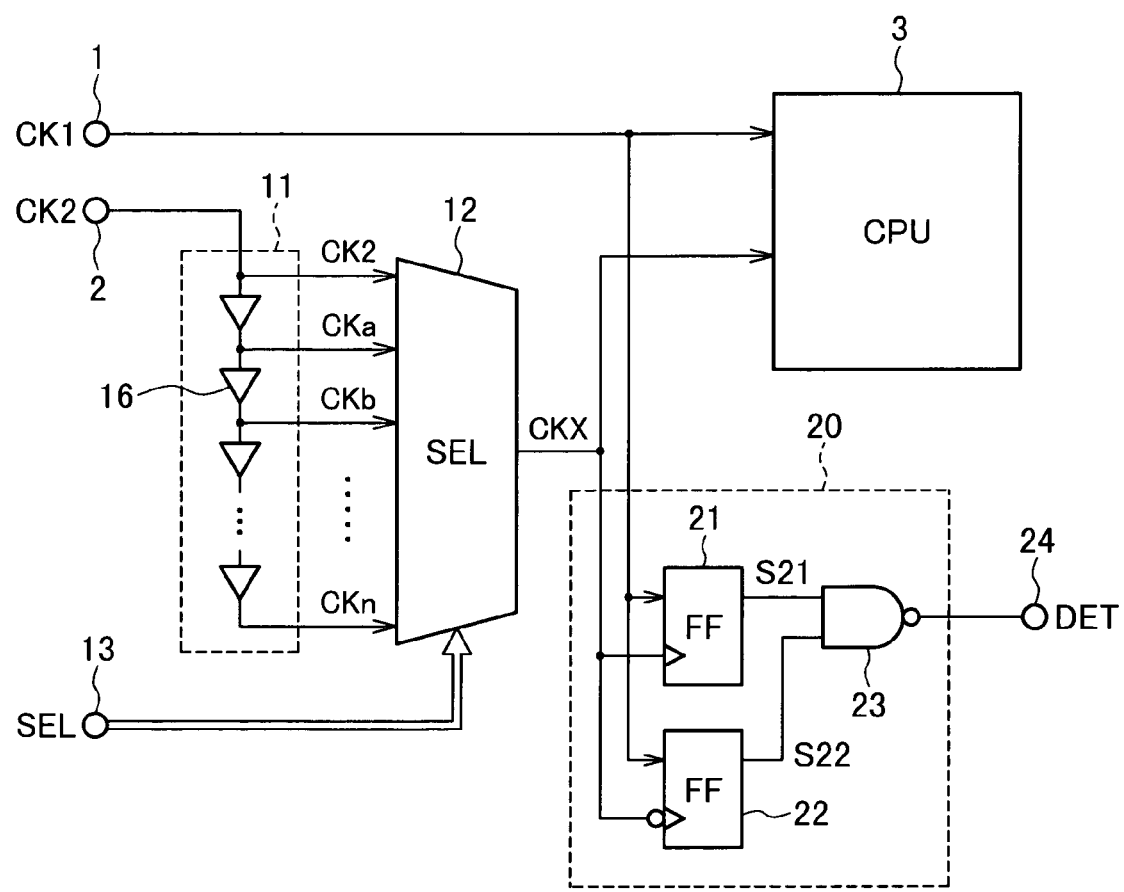
FIG. 1 is a circuit diagram of a phase adjustment circuit illustrating a first embodiment of the invention.

Embodiments of the invention will now be described with reference to the attached drawings, in which like elements are indicated by like reference characters.

First Embodiment

Referring to FIG. 1, the phase adjustment circuit in the first embodiment has input terminals 1, 2 that receive a first clock signal CK2 and a second clock signal CK1 that have a predetermined frequency relationship and, in principle, a phase relationship satisfying a predetermined condition. If, due to different propagation delays on the clock signal supply lines (not shown), the phase relationship between CK1 and CK2 fails to satisfy the predetermined condition, the phase adjustment circuit replaces CK2 with a clock signal CKX satisfying the condition, and supplies clock signals CK1 and CKX to a CPU 3.

The clock signals CK1 and CKX supplied to the CPU 3 may be required to satisfy various conditions. In the first embodiment, it will be assumed that the necessary conditions are a frequency ratio of 2:1, with the rising and falling edges of clock signal CKX occurring while clock signal CK1 is high. It will also be assumed that the input clock signals CK1 and CK2 have the necessary 2:1 frequency ratio.

The phase adjustment circuit in the first embodiment comprises a clock proliferator 11, a clock selector 12, and a phase difference detector 20.

The clock proliferator 11 comprises a cascaded series of delay elements such as logic gates or buffers 16, which delay the clock signal CK2 received from input terminal 2 and output clock signals CKa, CKb, . . . CKn delayed by successive amounts. The clock proliferator 11 also outputs the undelayed clock signal CK2. Clock signal CK2 and the delayed clock signals CKa, CKb, . . . CKn are supplied to the clock selector 12.

The clock selector 12 selects one of the clock signals CK2, CKa, . . . , CKn in accordance with a selection signal SEL supplied from an external terminal 13. The clock selector 12 outputs the selected clock signal as clock signal CKX to the CPU 3 and the phase difference detector 20.

The phase difference detector 20 also receives clock signal CK1 from input terminal 1, and determines whether the clock signals CK1 and CKX satisfy the above phase condition.

The phase difference detector 20 comprises a pair of flip-flops 21, 22 and a NAND gate 23. Both flip-flops 21, 22 receive clock signal CK1 as a data input and clock signal CKX as a clock input. The first flip-flop 21 latches the state of clock signal CK1 at rising edges of clock signal CKX; the second flip-flop 22 latches the state of clock signal CK1 at falling edges of clock signal CKX. The NAND gate 23 receives the outputs of both flip-flops and performs a well-known logic operation to obtain their negated logical AND. The resulting signal is output from the phase difference detector 20 to an external terminal 24 as a detection signal DET.

The input connections of the flip-flops 21, 22 in FIG. 1 are suitable when the frequency of clock signal CK1 is higher than the frequency of clock signal CK2.

The operation of the phase adjustment circuit shown in FIG. 1 will next be described with reference to the timing diagram shown in FIG. 2.

Figure 2:
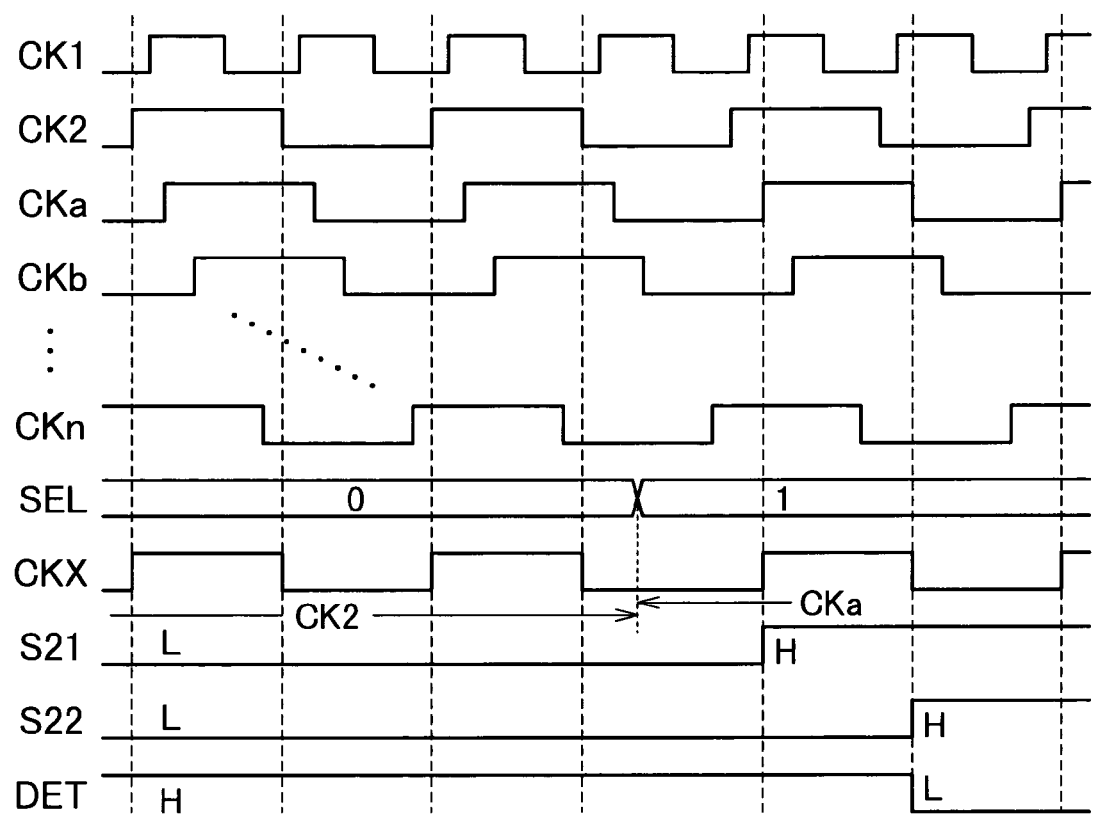
FIG. 2 is a timing diagram illustrating the operation of the phase adjustment circuit in FIG. 1.

In FIG. 2, if the value of the selection signal SEL supplied from external terminal 13 is '0', the clock selector 12 selects clock signal CK2 and supplies it as clock signal CKX to the CPU 3 and the flip-flops 21, 22 in the phase difference detector 20. If the value of the selection signal SEL is '1', the clock selector 12 selects clock signal CKa and supplies it as clock signal CKX to the CPU 3 and flip-flops 21, 22. Similarly, the clock selector 12 selects clock signal CKb if the value of the selection signal SEL is '2', and so on through CKn.

If the states of clock signal CK1 latched at the rising and falling edges of clock signal CKX by the flip-flops 21 and 22 are both high, the output signal S21 of flip-flop 21 and the output signal S22 of flip-flop 22 are both high. Accordingly, the detection signal DET supplied from the NAND gate 23 to the external terminal 24 is low, which indicates that the necessary condition is satisfied and the selection signal SEL may be left at its current value.

If the state of clock signal CK1 latched at either the rising or falling edge of clock signal CKX by flip-flop 21 or 22 is low, the output signal of the corresponding flip-flop 21 or 22 goes low. Accordingly, the detection signal DET supplied from the NAND gate 23 to the external terminal 24 goes high, which indicates that the necessary condition is not satisfied and the selection signal SEL should be changed to another value. The requisite change is made by, for example, an integrated circuit (not shown), separate from the phase adjustment circuit and CPU 3, that monitors the detection signal output at external terminal 24 and supplies the selection signal to external terminal 13.

The value of the selection signal SEL is changed as often as necessary until the detection signal DET goes low, then is held at the same value as long as the detection signal DET remains low. While DET is low, the CPU 3 receives a two-phase clock signal (CK1 and CKX) satisfying the conditions given above.

In FIG. 2, the selection signal SEL is initially '0', causing clock signal CK2 to be selected as CKX. Since the rising and falling edges of clock signal CK2 occur while clock signal CK1 is low, both flip-flop outputs S21, S22 are low (L), so the detection signal DET is high (H). The selection signal SEL is therefore changed to, for example, the next higher value '1', causing clock signal CKa to be selected as CKX. The rising and falling edges of clock signal CKa both occur while clock signal CK1 is high, so the flip-flop outputs S21, S22 both go high, and the detection signal DET goes low, indicating that the necessary phase condition is now satisfied. CKa continues to be selected as clock signal CKX as long as this condition is satisfied.

An advantage of the phase adjustment circuit in the first embodiment is that it selects and supplies the CPU 3 with a clock signal CKX satisfying the necessary phase condition regardless of variations in the delay times generated by the clock proliferator 11.

Second Embodiment

Figure 3:
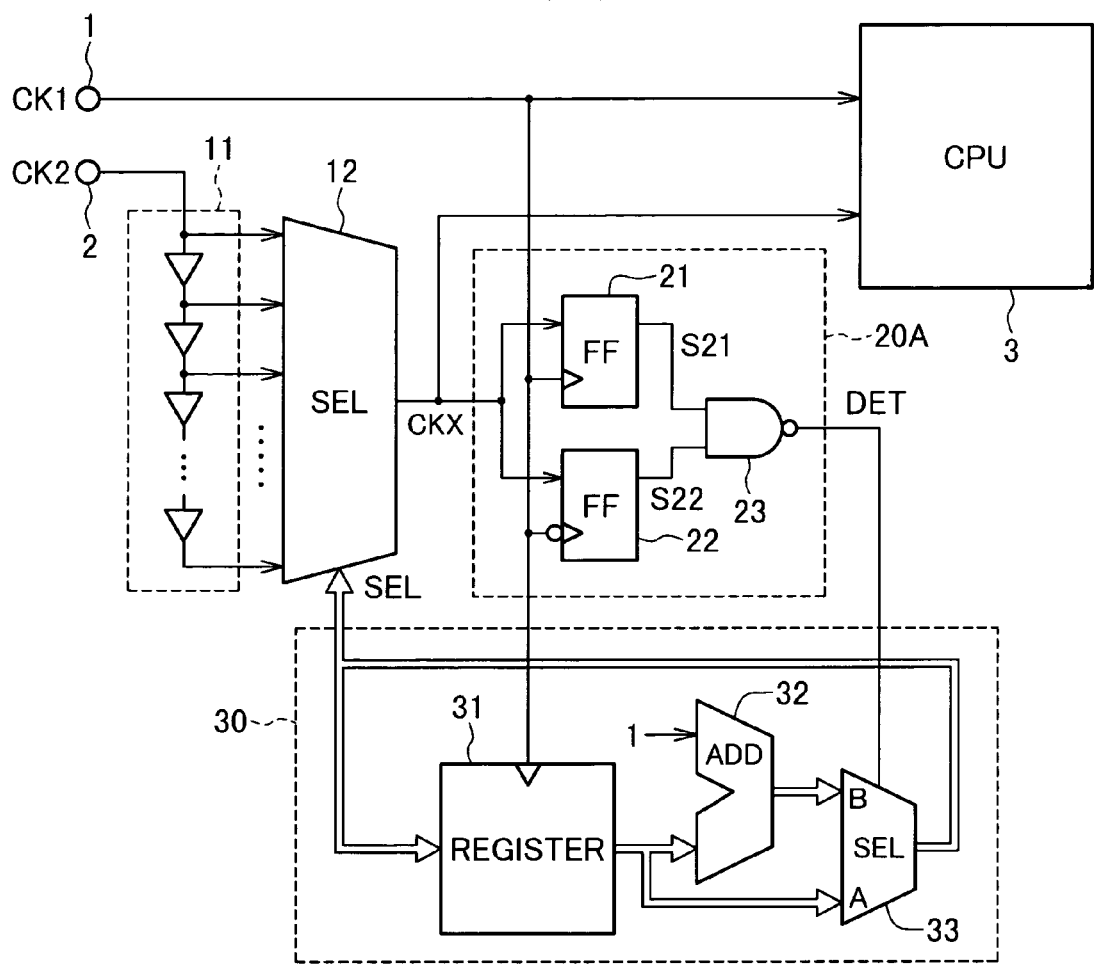
FIG. 3 is a circuit diagram of a phase adjustment circuit illustrating a second embodiment of the invention.

Referring to FIG. 3, the phase adjustment circuit in a second embodiment of the invention receives clock signals CK1 and CK2 having a 1:2 frequency ratio, and generates a pair of clock signals comprising clock signals CK1 and CKX having the same 1:2 frequency ratio, with the phase of clock signal CKX adjusted to satisfy the condition that the rising and falling edges of clock signal CK1 occur while clock signal CKX is high.

The phase adjustment circuit comprises input terminals 1 and 2, a clock proliferator 11, a clock selector 12, a phase difference detector 20A, and a selection signal generator 30. The input terminals 1 and 2 receive the second clock signal CK1 and first clock signal CK2, respectively. The clock proliferator 11 and clock selector 12 have the same structure and function as in the first embodiment. The clock signal CKX output from the clock selector 12 is supplied to the CPU 3 and the phase difference detector 20A.

The phase difference detector 20A receives the clock signal CK1 from the input terminal 1 and the clock signal CKX from the clock selector 12 and determines whether these two signals satisfy the above phase condition.

The phase difference detector 20A comprises the same flip-flops 21, 22 and NAND gate 23 as in the first embodiment, but the inputs to the flip-flops are reversed, CLKX being received as a data signal and CLK1 as a clock signal. The first flip-flop 21 latches the state of clock signal CKX at rising edges of clock signal CK1, and the second flip-flop 22 latches the state of clock signal CKX at falling edges of clock signal CK1. The NAND gate 23 takes the negated logical AND of the two flip-flop outputs to obtain a detection signal DET.

The input connections of the flip-flops 21, 22 in FIG. 3 are suitable when the frequency of clock signal CK1 is lower than the frequency of clock signal CK2.

The selection signal generator 30 receives the detection signal DET from the phase difference detector 20A, generates the selection signal SEL in accordance with DET, and supplies the selection signal SEL to the clock selector 12.

The selection signal generator 30 comprises a register 31, an adder 32 with two input terminals, and a selector 33 with two input terminals (A and B) and one control terminal. Selector 33 outputs the selection signal SEL to the clock selector 12 and the register 31. Register 31 latches the selection signal SEL at rising edges of clock signal CK1, and outputs the latched selection signal to the first input terminal of adder 32 and input terminal A of selector 33. The second input terminal of adder 32 receives a fixed value (e.g., '1'). The output of adder 32 is supplied to input terminal B of selector 33.

The control terminal of selector 33 receives the detection signal DET from the phase difference detector 20A. Selector 33 selects and outputs the signal received at input terminal A or B as the selection signal SEL, depending on whether the detection signal DET is high or low.

The value of the selection signal SEL output from the selection signal generator 30 increases cyclically within a given range while the detection signal DET output from the phase difference detector 20A indicates that the given condition is not satisfied. That is, it increases from zero to the highest value in the range, then returns to zero and begins increasing again. (Alternatively, the fixed input to the adder 31 may be '−1', in which case the value of the selection signal SEL decreases cyclically while the detection signal DET indicates that the given condition is not satisfied.)

Figure 4:
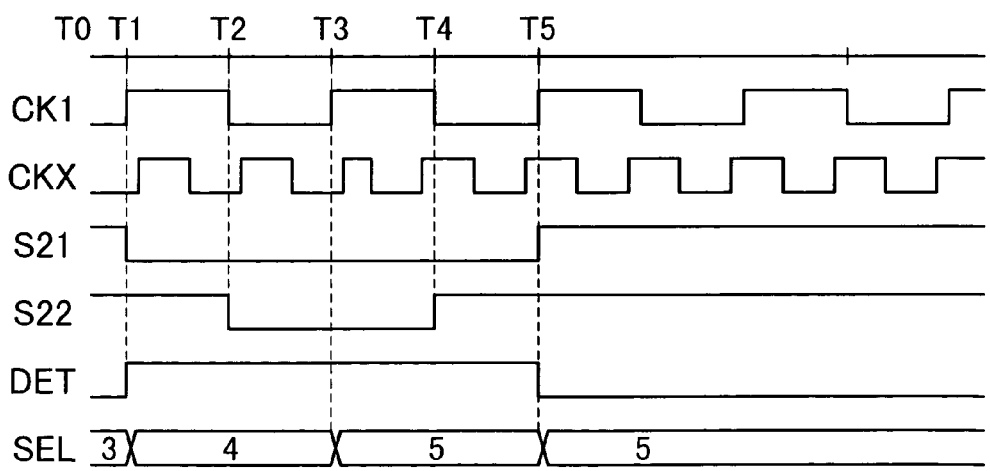
FIG. 4 is a timing diagram illustrating the operation of the phase adjustment circuit in FIG. 3.

The operation of the phase adjustment circuit shown in FIG. 3 will next be described with reference to the timing diagram shown in FIG. 4.

Initially, the value of the selection signal SEL output from the selection signal generator 30 is '3', and the clock signal CKX supplied by the clock selector 12 in accordance with the selection signal SEL satisfies the necessary condition with respect to clock signal CK1. Accordingly, at time T0 the flip-flop outputs S21, S22 are both high, the detection signal DET is low, and selector 33 selects the output of register 31. The value output from register 31 is '3', and the value output from adder 32 is '4'.

If a change in supply voltage, ambient temperature, or the like causes clock signal CK1 to rise importunely at time T1 while clock signal CKX is low, the signal S21 output from the flip-flop 21 goes low, and the detection signal DET goes high. Selector 33 now selects the output from adder 32, and the value of the selection signal SEL changes from '3' to '4'. The clock selector 12 therefore outputs a clock signal CKX with an altered phase, corresponding to the new value ('4') of the selection signal SEL.

At time T2, a falling edge of clock signal CK1 occurs while clock signal CKX is low, so the signal S22 output from flip-flop 22 goes low.

When clock signal CK1 rises at time T3, register 31 latches the new value ('4') of the selection signal SEL. The value output from register 31 becomes '4', and the value output from adder 32 becomes '5'. Because the detection signal DET is high at this time, selector 33 selects the output of adder 32, and the value of the selection signal SEL output from selector 33 becomes '5'. The clock selector 12 again alters the phase of clock signal CKX, corresponding to the new selection signal value ('5').

At time T4, a falling edge of clock signal CK1 occurs while clock signal CKX is high, so the signal S22 output from flip-flop 22 returns to the high level.

When clock signal CK1 rises at time T5, register 31 latches the new value ('5') of selection signal SEL and outputs this value. Clock signal CKX is high at this time, so the signal S21 output from flip-flop 21 also returns to the high level. This brings the detection signal DET low, causing selector 33 to select the output of register 31, and the value of the selection signal SEL output from selector 33 remains unchanged at '5'.

The phase adjustment circuit in the second embodiment has the same effect as the phase adjustment circuit in the first embodiment. Moreover, because it includes the selection signal generator 30, which generates the selection signal SEL in accordance with the detection signal DET supplied from the phase difference detector 20A and supplies the selection signal SEL to the clock selector 12, the number of external terminals can be reduced, and the need to set the selection signal SEL externally while monitoring the detection signal DET is eliminated. Even if the timing relationship of the input clock signals CK1 and CK2 varies because of a change in temperature, supply voltage, or some other factor in the operating environment, a clock signal satisfying the necessary condition is automatically reselected.

The above embodiments can be modified in many ways, some of which will now be described.

(a) The conditions that the two clock signals CK1 and CKX must satisfy may be modified. The phase difference detector 20 or 20A should be reconfigured to determine whether the modified condition is satisfied. For example, if the input clock signals CK1 and CK2 have the same frequency and the necessary condition is that input clock signal CK1 must lead the selected clock signal CKX, the input connections of the phase difference detector may be modified so that flip-flop 21 latches clock signal CK1 at rising edges of clock signal CKX (as in FIG. 1) and flip-flop 22 latches clock signal CKX at falling edges of clock signal CK1 (as in FIG. 3).

Figure 5:
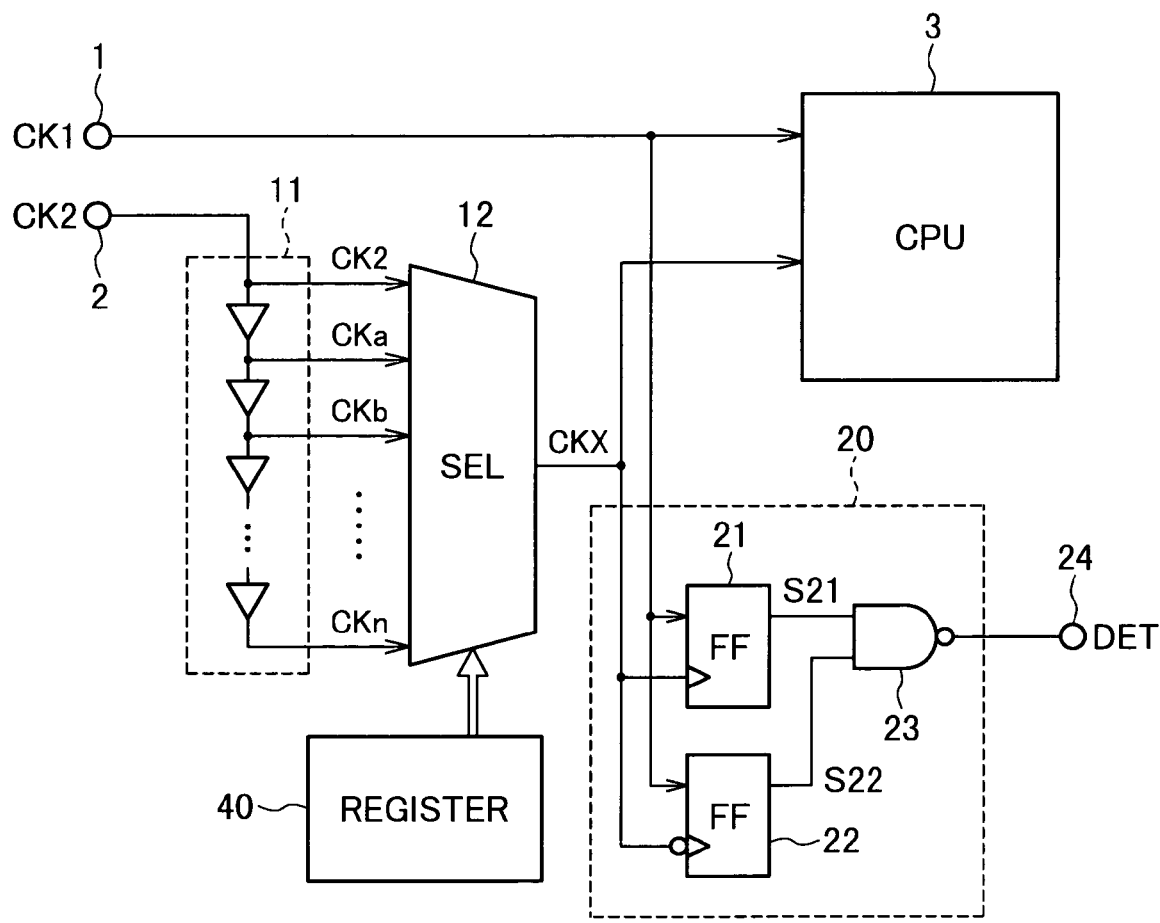
FIG. 5 is a circuit diagram illustrating a variation of the first embodiment.

(b) As shown in FIG. 5, an externally writable register 40 for holding the value of the selection signal SEL may be provided in the first embodiment. The value of the selection signal SEL can be written in register 40 by a microprocessor or the like separate from the CPU 3, instead of having the selection signal SEL received at external terminal 13 in FIG. 1.

(c) The selection signal generator 30 in the second embodiment may include a binary counter that counts cyclically from zero to some positive integer (n) at rising edges of clock signal CK1 while the detection signal DET is high, and outputs the resulting count value as the selection signal SEL.

Those skilled in the art will recognize that still further variations are possible within the scope of the invention, which is defined by the appended claims.

What is claimed is:

1. A phase adjustment circuit that receives a first pair of clock signals and outputs a second pair of clock signals with phases satisfying a predetermined condition to a central processing unit, comprising:
   a clock proliferator that receives a first clock signal and generates a plurality of clock signals therefrom;
   a clock selector that receives said plurality of clock signals from the clock proliferator, selects one of the received plurality of clock signals in accordance with a selection signal, and outputs a selected clock signal; and
   a phase difference detector that receives the selected clock signal and a second clock signal differing in frequency from the first clock signal and the selected clock signal, determines whether the phase of the second clock signal and the phase of the selected clock signal satisfy the predetermined condition, and outputs a detection signal indicating whether the predetermined condition is satisfied;
   the first clock signal and the second clock signal constituting the first pair of clock signals;

the second clock signal and the selected clock signal constituting the second pair of clock signals;

wherein the selected clock signal has a lower frequency than the second clock signal, and the predetermined condition specifies that all rising and falling edges of the selected clock signal occur while the second clock signal is high.

2. The phase adjustment circuit of claim 1, wherein the clock proliferators generates the plurality of clock signals by delaying the first clock signal by different amounts.

3. The phase adjustment circuit of claim 2, wherein the clock proliferators comprises a cascaded plurality of delay elements.

4. The phase adjustment circuit of claim 1, further comprising:
an external input terminal for input of the selection signal; and
an external output terminal for output of the detection signal.

5. The phase adjustment circuit of claim 1, further comprising:
an externally writable register that stores the selection signal and supplies the selection signal to the clock selector; and
an external output terminal for output of the detection signal.

6. The phase adjustment circuit of claim 1, wherein the phase difference detector comprises:
a first flip-flop that latches and outputs the state of the second clock signal at rising edges of the selected clock signal;
a second flip-flop that latches and outputs the state of the second clock signal at falling edges of the selected clock signal; and
a logic circuit that performs a logic operation on outputs of the first flip-flop and the second flip-flop, thereby generating the detection signal.

7. The phase adjustment circuit of claim 6, wherein the first clock signal has a lower frequency than the second clock signal.

8. The phase adjustment circuit of claim 1, wherein the phase difference detector comprises:
a first-flop that latches and outputs the state of the selected clock signal at rising edges of the second clock signal;
a second flip-flop that latches and outputs the state of the second clock signal at falling edges of the selected clock signal; and
a logic circuit that performs a logic operation on outputs of the first flip-flop and the second flip-flop, thereby generating the detection signal.

9. The phase adjustment circuit of claim 8, wherein the first clock signal has a higher frequency than the second clock signal.

10. The phase adjustment circuit of claim 1, further comprising a selection signal generator that receives the detection signal and generates the selection signal.

11. The phase adjustment circuit of claim 10, wherein the selection signal generator cyclically increases or decreases the selection signal within a certain range of values while the detection signal indicates that the predetermined condition is not satisfied, and holds the selection signal constant while the detection signal indicates that the predetermined condition is satisfied.

12. The phase adjustment circuit of claim 10, wherein the selection signal generator comprises:
a register that stores the value of the selection signal;
an adder that adds a fixed value to the value stored in the register to generate a sum value; and
a selector that receives the value stored in the register and the sum value, selects the value stored in the register when the detection signal indicates that the predetermined condition is satisfied, selects the sum value when the detection signal indicates that the predetermined condition is not satisfied, writes the selected value in the register, and supplies the selected value to the clock selector as the selection signal.

13. A phase adjustment circuit that receives a first pair of clock signals and outputs a second pair of clock signals with phases satisfying a predetermined condition to a central processing unit, comprising:
a clock proliferator that receives a first clock signal and generates a plurality of clock signals therefrom;
a clock selector that receives said plurality of clock signals from the clock proliferator, selects one of the received plurality of clock signals in accordance with a selection signal, and outputs a selected clock signal; and
a phase difference detector that receives the selected clock signal and a second clock signal differing in frequency from the first clock signal and the selected clock signal, determines whether the phase of the second clock signal and the phase of the selected clock signal satisfy the predetermined condition, and outputs a detection signal indicating whether the predetermined condition is satisfied;
the first clock signal and the second clock signal constituting the first pair of clock signals;
the second clock signal and the selected clock signal constituting the second pair of clock signals;
wherein the selected clock signal has a higher frequency than the second clock signal, and the predetermined condition specifies that all rising and falling edges of the second clock signal occur while the selected clock signal is high.

14. The phase adjustment circuit of claim 13, wherein the clock proliferators generates the plurality of clock signals by delaying the first clock signal by different amounts.

15. The phase adjustment circuit of claim 14, wherein the clock proliferators comprises a cascaded plurality of delay elements.

16. The phase adjustment circuit of claim 13, further comprising:
an external input terminal for input of the selection signal; and
an external output terminal for output of the detection signal.

17. The phase adjustment circuit of claim 13, further comprising:
an externally writable register that stores the selection signal and supplies the selection signal to the clock selector; and
an external output terminal for output of the detection signal.

18. The phase adjustment circuit of claim 13, further comprising a selection signal generator that receives the detection signal and generates the selection signal.

19. The phase adjustment circuit of claim 18, wherein the selection signal generator cyclically increases or decreases the selection signal within a certain range of values while the detection signal indicates that the predetermined condition is not satisfied, and holds the selection signal constant while the detection signal indicates that the predetermined condition is satisfied.

20. The phase adjustment circuit of claim 18, wherein the selection signal generator comprises:
- a register that stores the value of the selection signal;
- an adder that adds a fixed value to the value stored in the register to generate a sum value; and
- a selector that receives the value stored in the register and the sum value, selects the value stored in the register when the detection signal indicates that the predetermined condition is satisfied, selects the sum value when the detection signal indicates that the predetermined condition is not satisfied, writes the selected value in the register, and supplies the selected value to the clock selector as the selection signal.

* * * * *